United States Patent
Alkan et al.

(10) Patent No.: US 11,444,592 B2
(45) Date of Patent: *Sep. 13, 2022

(54) FILTER CIRCUIT

(71) Applicant: PPC Broadband, Inc., East Syracuse, NY (US)

(72) Inventors: Erdogan Alkan, Manlius, NY (US); Raymond W. Palinkas, Canastota, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 39 days.

This patent is subject to a terminal disclaimer.

(21) Appl. No.: 16/938,218

(22) Filed: Jul. 24, 2020

(65) Prior Publication Data

US 2020/0358417 A1 Nov. 12, 2020

Related U.S. Application Data

(60) Continuation of application No. 16/359,335, filed on Mar. 20, 2019, now Pat. No. 10,790,793, which is a continuation of application No. 15/937,239, filed on Mar. 27, 2018, now Pat. No. 10,284,162, which is a continuation of application No. 15/049,805, filed on Feb. 22, 2016, now Pat. No. 9,979,373, which is a division of application No. 13/918,639, filed on Jun. 14, 2013, now Pat. No. 9,306,530, which is a
(Continued)

(51) Int. Cl.
*H03H 7/01* (2006.01)
*H03H 7/06* (2006.01)

(52) U.S. Cl.
CPC ............ *H03H 7/0161* (2013.01); *H03H 7/01* (2013.01); *H03H 7/0138* (2013.01); *H03H 7/06* (2013.01); *H03H 7/1741* (2013.01)

(58) Field of Classification Search
CPC ...... H03H 7/0161; H03H 7/01; H03H 7/0138; H03H 7/06; H03H 7/1741
USPC ..... 333/81 A, 100, 129, 132, 167, 168, 175, 333/176, 307; 455/296
See application file for complete search history.

(56) References Cited

U.S. PATENT DOCUMENTS 2,260,494 A 10/1941 Dante
2,662,217 A 12/1953 Roberts
(Continued)

FOREIGN PATENT DOCUMENTS

JP 55-80989 A 6/1980
JP 55-132126 A 10/1980
(Continued)

OTHER PUBLICATIONS

Author Unknown, International Search Report dated May 31, 2011, PCT Application No. PCT/US2010/049568, filed Sep. 21, 2010.
(Continued)

*Primary Examiner* — Hafizur Rahman
(74) *Attorney, Agent, or Firm* — MH2 Technology Law Group LLP

(57) ABSTRACT

A filter circuit includes a pass band filter portion configured to pass signals in a first frequency spectrum and attenuate or block signals in a second frequency spectrum. The first frequency spectrum and the second frequency spectrum do not overlap. The pass band filter portion is configured to cause a return loss of more than 10 decibels (dB) in the first frequency spectrum.

56 Claims, 6 Drawing Sheets

Related U.S. Application Data continuation of application No. 12/697,589, filed on Feb. 1, 2010, now Pat. No. 8,487,717.

(56) References Cited

U.S. PATENT DOCUMENTS

| | | | |
|---|---|---|---|
| 3,790,909 A | 2/1974 | LeFevre | |
| 3,939,431 A | 2/1976 | Cohlman | |
| 4,003,005 A | 1/1977 | Mukherjee et al. | |
| 4,027,219 A | 5/1977 | Van Alphen et al. | |
| 4,306,403 A | 12/1981 | Hubbard et al. | |
| 4,344,499 A | 8/1982 | Van der Lely et al. | |
| 4,512,033 A | 4/1985 | Schrock | |
| 4,520,508 A | 5/1985 | Reichert, Jr. | |
| 4,648,123 A | 3/1987 | Schrock | |
| 4,677,390 A | 6/1987 | Wagner | |
| 4,715,012 A | 12/1987 | Mueller, Jr. | |
| 4,961,218 A | 10/1990 | Kiko | |
| 4,982,440 A | 1/1991 | Dufresne et al. | |
| 5,010,399 A | 4/1991 | Goodman et al. | |
| 5,126,686 A | 6/1992 | Tam | |
| 5,126,840 A | 6/1992 | Dufresne et al. | |
| 5,214,505 A | 5/1993 | Rabowsky et al. | |
| 5,231,660 A | 7/1993 | West, Jr. | |
| 5,245,300 A | 9/1993 | Sasaki et al. | |
| 5,369,642 A | 11/1994 | Shioka et al. | |
| 5,485,630 A | 1/1996 | Lee et al. | |
| 5,548,255 A | 8/1996 | Spielman | |
| 5,557,319 A | 9/1996 | Gurusami et al. | |
| 5,557,510 A | 9/1996 | McIntyre et al. | |
| 5,604,528 A | 2/1997 | Edwards et al. | |
| 5,719,792 A | 2/1998 | Bush | |
| 5,740,044 A | 4/1998 | Ehrenhardt et al. | |
| 5,745,836 A | 4/1998 | Williams | |
| 5,745,838 A | 4/1998 | Tresness et al. | |
| 5,815,794 A | 9/1998 | Williams | |
| 5,839,052 A | 11/1998 | Dean et al. | |
| 5,893,024 A | 4/1999 | Sanders et al. | |
| 5,937,330 A | 8/1999 | Vince et al. | |
| 5,950,111 A | 9/1999 | Georger et al. | |
| 5,970,053 A | 10/1999 | Schick et al. | |
| 6,012,271 A | 1/2000 | Wilkens et al. | |
| 6,014,547 A | 1/2000 | Caporizzo et al. | |
| 6,031,432 A | 2/2000 | Schreuders | |
| 6,049,693 A | 4/2000 | Baran et al. | |
| 6,069,960 A | 5/2000 | Mizukami et al. | |
| 6,094,211 A | 7/2000 | Baran | |
| 6,101,932 A | 8/2000 | Wilkens | |
| 6,128,040 A | 10/2000 | Shinbori et al. | |
| 6,129,187 A | 10/2000 | Bellanger et al. | |
| 6,173,225 B1 | 1/2001 | Stelzle et al. | |
| 6,185,432 B1 | 2/2001 | Vembu | |
| 6,205,138 B1 | 3/2001 | Nihal et al. | |
| 6,229,375 B1 | 5/2001 | Koen | |
| 6,321,384 B1 | 11/2001 | Eldering | |
| 6,348,837 B1 | 2/2002 | Ibelings | |
| 6,348,955 B1 | 2/2002 | Tait | |
| 6,373,349 B2 | 4/2002 | Gilbert | |
| 6,377,316 B1 | 4/2002 | Mycynek et al. | |
| 6,388,539 B1 | 5/2002 | Rice | |
| 6,425,132 B1 | 7/2002 | Chappell | |
| 6,430,904 B1 | 8/2002 | Coers et al. | |
| 6,495,998 B1 | 12/2002 | Terreault | |
| 6,498,925 B1 | 12/2002 | Tauchi | |
| 6,510,152 B1 | 1/2003 | Gerszberg et al. | |
| 6,546,705 B2 | 4/2003 | Scarlett et al. | |
| 6,550,063 B1 | 4/2003 | Matsuura | |
| 6,560,778 B1 | 5/2003 | Hasegawa | |
| 6,570,928 B1 | 5/2003 | Shibata | |
| 6,587,012 B1 | 7/2003 | Farmer et al. | |
| 6,622,304 B1 | 9/2003 | Carhart | |
| 6,640,338 B1 | 10/2003 | Shibata | |
| 6,678,893 B1 | 1/2004 | Jung | |
| 6,683,513 B2 | 1/2004 | Shamsaifar et al. | |
| 6,725,462 B1 | 4/2004 | Kaplan | |
| 6,728,968 B1 | 4/2004 | Abe et al. | |
| 6,737,935 B1 | 5/2004 | Shafer | |
| 6,757,910 B1 | 6/2004 | Bianu | |
| 6,758,292 B2 | 7/2004 | Shoemaker | |
| 6,804,828 B1 | 10/2004 | Shibata | |
| 6,843,044 B2 | 1/2005 | Clauss | |
| 6,845,232 B2 | 1/2005 | Darabi | |
| 6,920,614 B1 | 1/2005 | Schindler et al. | |
| 6,868,552 B1 | 3/2005 | Masuda et al. | |
| 6,877,166 B1 | 4/2005 | Roeck et al. | |
| 6,928,175 B1 | 8/2005 | Bader et al. | |
| 6,942,595 B2 | 9/2005 | Hrazdera | |
| 7,003,275 B1 | 2/2006 | Petrovic | |
| 7,029,293 B2 | 4/2006 | Shapson et al. | |
| 7,039,432 B2 | 5/2006 | Strater et al. | |
| 7,048,106 B2 | 5/2006 | Hou | |
| 7,127,734 B1 | 10/2006 | Amit | |
| 7,162,731 B2 | 1/2007 | Reidhead et al. | |
| 7,254,827 B1 | 8/2007 | Terreault | |
| 7,283,479 B2 | 10/2007 | Ljungdahl et al. | |
| 7,399,255 B1 | 7/2008 | Johnson et al. | |
| 7,404,355 B2 | 7/2008 | Viaud et al. | |
| 7,416,068 B2 | 8/2008 | Ray et al. | |
| 7,454,252 B2 | 11/2008 | El-Sayed | |
| 7,464,526 B2 | 12/2008 | Coenen | |
| 7,505,819 B2 | 3/2009 | El-Sayed | |
| 7,508,284 B2 | 3/2009 | Shafer | |
| 7,530,091 B2 | 5/2009 | Vaughan | |
| 7,592,883 B2 | 9/2009 | Shafer | |
| 7,675,381 B2 | 6/2010 | Lin | |
| 7,742,777 B2 | 6/2010 | Strater et al. | |
| 7,783,195 B2 | 8/2010 | Riggsby | |
| 7,952,451 B2 | 5/2011 | Beerwerth | |
| 8,179,814 B2 | 5/2012 | Shafer et al. | |
| 8,487,717 B2 | 7/2013 | Alkan | |
| 9,306,530 B2 | 4/2016 | Alkan et al. | |
| 9,979,373 B2 | 5/2018 | Alkan | |
| 10,790,793 B2 * | 9/2020 | Alkan | H03H 7/06 |
| 2001/0016950 A1 | 8/2001 | Matsuura | |
| 2002/0084871 A1 | 7/2002 | Fallahi | |
| 2002/0141347 A1 | 10/2002 | Harp et al. | |
| 2002/0144292 A1 | 10/2002 | Uemura et al. | |
| 2002/0166124 A1 | 11/2002 | Gurantz et al. | |
| 2002/0174423 A1 | 11/2002 | Fifield et al. | |
| 2003/0084458 A1 | 5/2003 | Ljungdahl et al. | |
| 2004/0147273 A1 | 7/2004 | Morphy | |
| 2004/0172659 A1 | 9/2004 | Ljungdahl et al. | |
| 2004/0229561 A1 | 11/2004 | Cowley et al. | |
| 2005/0034168 A1 | 2/2005 | Beveridge | |
| 2005/0047051 A1 | 3/2005 | Marland | |
| 2005/0144649 A1 | 6/2005 | Bertonis | |
| 2005/0183130 A1 | 8/2005 | Sadja et al. | |
| 2005/0210977 A1 | 9/2005 | Yan | |
| 2005/0283815 A1 | 12/2005 | Brooks et al. | |
| 2005/0289632 A1 | 12/2005 | Brooks et al. | |
| 2006/0015921 A1 | 1/2006 | Vaughan | |
| 2006/0041918 A9 | 2/2006 | Currivan et al. | |
| 2006/0191359 A1 | 8/2006 | Tarasinski et al. | |
| 2006/0205442 A1 | 9/2006 | Phillips et al. | |
| 2006/0241838 A1 | 10/2006 | Mongiardo et al. | |
| 2006/0282871 A1 | 12/2006 | Yo | |
| 2007/0024393 A1 | 2/2007 | Forse et al. | |
| 2007/0288981 A1 | 12/2007 | Mitsuse et al. | |
| 2007/0288982 A1 | 12/2007 | Donahue | |
| 2008/0001645 A1 | 1/2008 | Kuroki | |
| 2008/0022344 A1 | 1/2008 | Riggsby | |
| 2008/0040764 A1 | 2/2008 | Weinstein et al. | |
| 2008/0120667 A1 | 5/2008 | Zaltsman | |
| 2008/0127287 A1 | 5/2008 | Alkan et al. | |
| 2008/0157898 A1 | 7/2008 | Palinkas et al. | |
| 2008/0168518 A1 | 7/2008 | Hsue et al. | |
| 2008/0247401 A1 | 10/2008 | Bhal et al. | |
| 2008/0247541 A1 | 10/2008 | Cholas et al. | |
| 2008/0271094 A1 | 10/2008 | Kliger et al. | |
| 2008/0313691 A1 | 12/2008 | Cholas et al. | |
| 2009/0031391 A1 | 1/2009 | Urbanek | |
| 2009/0047917 A1 | 2/2009 | Philips et al. | |
| 2009/0047919 A1 | 2/2009 | Phillips et al. | |
| 2009/0077608 A1 | 3/2009 | Romerein et al. | |
| 2009/0153263 A1 | 6/2009 | Lin | |

(56) References Cited

U.S. PATENT DOCUMENTS

| | | |
|---|---|---|
| 2009/0165070 A1 | 6/2009 | McMullin et al. |
| 2009/0180782 A1 | 7/2009 | Bernard et al. |
| 2009/0217325 A1 | 8/2009 | Kliger et al. |
| 2009/0320086 A1 | 12/2009 | Rijssemus et al. |
| 2010/0017842 A1 | 1/2010 | Wells |
| 2010/0095344 A1 | 4/2010 | Newby |
| 2010/0100918 A1 | 4/2010 | Egan |
| 2010/0125877 A1 | 5/2010 | Wells |
| 2010/0146564 A1 | 6/2010 | Halik |
| 2010/0162340 A1 | 6/2010 | Riggsby |
| 2010/0194489 A1 | 8/2010 | Kearns et al. |
| 2010/0225813 A1 | 9/2010 | Hirono et al. |
| 2011/0010749 A1 | 1/2011 | Alkan |
| 2011/0051014 A1 | 3/2011 | Wang et al. |
| 2011/0069740 A1 | 3/2011 | Cowley et al. |
| 2011/0072472 A1 | 3/2011 | Wells |
| 2011/0181371 A1 | 7/2011 | Alkan |
| 2011/0258677 A1 | 10/2011 | Shafer |
| 2012/0054805 A1 | 3/2012 | Shafer |
| 2012/0054819 A1 | 3/2012 | Alkan |
| 2012/0081190 A1 | 4/2012 | Rijssemus |
| 2012/0159556 A1 | 6/2012 | Alkan |
| 2012/0331501 A1 | 12/2012 | Shafer |
| 2013/0081096 A1 | 3/2013 | Wells et al. |

FOREIGN PATENT DOCUMENTS

| | | |
|---|---|---|
| JP | 58-99913 | 12/1981 |
| JP | 57-091055 A | 6/1982 |
| JP | 58-101582 A | 6/1983 |
| JP | 59026709 | 8/1984 |
| JP | 61-157035 A | 7/1986 |
| JP | 05-191416 A | 7/1993 |
| JP | 07-038580 A | 2/1995 |
| JP | 11-069334 A | 3/1999 |
| JP | 2001-177580 A | 6/2001 |
| JP | 2004-080483 | 3/2004 |
| JP | 2005-005875 | 1/2005 |
| JP | 2007-166109 A | 6/2007 |
| JP | 2007-166110 A | 6/2007 |
| WO | 0024124 A1 | 4/2000 |
| WO | 0172005 A1 | 9/2001 |
| WO | 0233969 A1 | 4/2002 |
| WO | 02091676 A1 | 11/2002 |

OTHER PUBLICATIONS

Wells, "Cable Television Entry Adapter", U.S. Appl. No. 13/245,510, filed Sep. 26, 2011.

Author Unknown, Office Action Summary dated Mar. 6, 2012, U.S. Appl. No. 12/563,719, filed Sep. 21, 2009.

Author Unknown, Office Action Summary dated Jan. 23, 2012, U.S. Appl. No. 12/250,229, filed Oct. 13, 2008.

Author Unknown, Office Action Summary dated Nov. 11, 2011, U.S. Appl. No. 12/255,008, filed Oct. 21, 2008.

Coil craft article, "Inductors as RF Chokes", document 945-2 Revised Apr. 13, 2011 (Year 2011).

\* cited by examiner

FILTER CIRCUIT

CROSS-REFERENCE TO RELATED APPLICATIONS

This application is a continuation of U.S. patent application Ser. No. 16/359,335, filed Mar. 20, 2019, now U.S. Pat. No. 10,790,793, issued Sep. 29, 2020, which is a continuation of U.S. patent application Ser. No. 15/937,239, filed Mar. 27, 2018, now U.S. Pat. No. 10,284,162, issued May 7, 2019, which is a continuation of U.S. patent application Ser. No. 15/049,805, filed Feb. 22, 2016, now U.S. Pat. No. 9,979,373, issued May 22, 2018, which is a divisional of U.S. patent application Ser. No. 13/918,639, filed Jun. 14, 2013, now U.S. Pat. No. 9,306,530, issued Apr. 5, 2016, which is a continuation of U.S. patent application Ser. No. 12/697,589, filed Feb. 1, 2010, now U.S. Pat. No. 8,487,717, issued Jul. 16, 2013, by Erdogan Akan and Raymond W. Palinkas and entitled "Multipath Mitigation Circuit for Home Network." Each of the foregoing applications is incorporated herein by reference.

FIELD

The present invention relates generally to an electronic filter assembly for use in the cable television (CATV) industry, and more specifically to a circuit assembly that mitigates home data network signals from reflecting within a user's network.

BACKGROUND

In many data distribution networks, electrical signals conveying information propagate along transmission lines across distances and through splitting devices. For example, in a cable television (CATV) network, media content propagates downstream from a head-end facility toward media devices located in various facilities such as homes and businesses. Along the way, the electrical signals conveying the media content propagate along main trunks, through taps, and along multiple branches that ultimately distribute the content to drop cables at respective facilities. The drop cable, which may be a single coaxial cable, typically is connected to a splitting device having two or more outlet ports. Distribution cables connected to the outlet ports route the signals to various rooms, often extending to one or more media devices. The network of distribution cables, splitters, and distribution points is referred to as a drop system.

A typical data distribution network provides many content selections to a user's media devices within the drop system, such as one or more televisions equipped with set top boxes or cable modems. Content selection propagated on a downstream bandwidth of the CATV system may include broadcast television channels, video on demand services, internet data, home security services, and voice over internet (VOIP) services. The content selections are typically propagated in a discrete frequency range, or channel, that is distinct from the frequency ranges of other content selections. Downstream bandwidth includes frequencies typically ranging from 50-1,000 megahertz (MHz).

The typical data distribution network is a two-way communication system. The downstream bandwidth carries signals from the head end to the user and an upstream bandwidth carries upstream signals from the user to the head end. Upstream bandwidth may include data related to video on demand services, such as video requests and billing authorization; internet uploads, such as photo albums or user account information; security monitoring; or other services predicated on signals or data emanating from a subscriber's home. Upstream bandwidth frequencies typically range from 7-49 MHz.

A user data network, or home network, may be coupled to the cable television network via the same coaxial cable delivering the downstream and upstream bandwidth of the CATV system. Often, the user data network is a home entertainment network providing multiple streams of high definition video and entertainment. Examples of home networking technologies include Ethernet, HomePlug, HPNA, and 802.11n. In another example, the user data network may employ technology standards developed by the Multimedia over Coax Alliance (MoCA). The MoCA standards promote networking of personal data utilizing the existing coaxial cable that is already wired throughout the user premises. MoCA technology provides the backbone for personal data networks of multiple wired and wireless products including voice, data, security, home heating/cooling, and video technologies. In such an arrangement, the cable drop from the cable system operator shares the coaxial line or network connection with MoCA-certified devices such as a broadband router or a set top box. The operators use coaxial wiring already existing within the home or business to interconnect the wired and wireless MoCA devices by directly connecting them to the coaxial jacks throughout the premises. MoCA technology delivers broadband-caliber data rates exceeding 130 Mbps, and supports as many as sixteen end points.

A MoCA-certified device such as the broadband router interconnects other MoCA-certified components located within the premises, for example additional set top boxes, routers and gateways, bridges, optical network terminals, computers, gaming systems, display devices, printers, network-attached storage, and home automation such as furnace settings and lighting control. The home network allows distribution and sharing of data or entertainment content among the MoCA-connected devices. For example, a high definition program recorded on a set top box in the living room may be played back by a second set top box located in a bedroom. And, a high definition movie recorded on a camcorder and stored on a user's personal computer may be accessed and displayed through any of the set top boxes within the premises. The home network may also allow high-definition gaming between rooms.

The home network may utilize an open spectrum bandwidth on the coaxial cable to transmit the personal data content, such as entertainment content. For example, a cable system operator may utilize a bandwidth of frequencies up to 1002 MHz, and a satellite system operator may utilize a bandwidth of frequencies from 1550-2450 MHz. The unused range of frequencies in this example, or open spectrum bandwidth, is 1002-1550 MHz. In another example, the open spectrum bandwidth may be higher than 2450 MHz. In one particular example, the Multimedia over Coax Alliance specifies an open spectrum, or home network bandwidth, of 1125-1525 MHz. A home network utilizing the open spectrum bandwidth does not interfere with any of the bandwidth being utilized by the cable television or satellite services provider.

An exemplary filter designed for use in a MoCA network is installed at the point of entry to a premises to allow MoCA transmissions to propagate throughout the home network while preventing the them from interfering with adjacent subscribers in the CATV network. Thus, the MoCA filter passes signals in the provider bandwidth and attenuates signals in the home network bandwidth. One problem noted with existing MoCA filters attenuating the home network spectrum is multipath interference. Multipath interference, or distortion, is a phenomenon in the physics of waves in which a wave from a transmitter travels to a receiver via two or more paths and, under the right conditions, two or more of the wave components interfere. The interference arises due to the wave components having travelled a different path defined by diffraction and the geometric length. The differing speed results in the wave components arriving at the receiver out of phase with each other. Multipath interference is a common cause of "ghosting" in analog television broadcasts, and is exacerbated m a MoCA network because the MoCA standard requires very high transmission energy (e.g., low power loss in the MoCA bandwidth). This high transmission power results in greater reflections at the ports of devices.

SUMMARY

A filter circuit is disclosed. The filter circuit includes an input and an output. The filter circuit also includes a pass band filter portion between the input and the output. The pass band filter portion is configured to pass signals between the input and the output in a first frequency spectrum and attenuate or block signals between the input and the output in a second frequency spectrum. The first frequency spectrum and the second frequency spectrum do not overlap. The filter circuit also includes an interference mitigation portion configured to be connected to the pass band filter portion. The interference mitigation portion includes an attenuator circuit that is configured to increase a return loss at the output in the second frequency spectrum without substantially affecting a frequency response of a remainder of the filter circuit.

In another embodiment, the filter circuit includes means for passing signals between an input and an output in a first frequency spectrum and attenuating or blocking signals between the input and the output in a second frequency spectrum. The first frequency spectrum and the second frequency spectrum do not overlap. The filter circuit also includes means for increasing a return loss at the output in the second frequency spectrum without substantially affecting a frequency response of a remainder of the filter circuit.

In another embodiment, the filter circuit includes a pass band filter portion configured to pass signals in a first frequency spectrum and attenuate or block signals in a second frequency spectrum. The first frequency spectrum and the second frequency spectrum do not overlap. The pass band filter portion is configured to cause a return loss of more than 10 decibels (dB) in the first frequency spectrum.

BRIEF DESCRIPTION OF THE DRAWINGS

For a further understanding of the invention, reference will be made to the following detailed description of the invention which is to be read in connection with the accompanying drawing, wherein.

DETAILED DESCRIPTION

Figure 1:
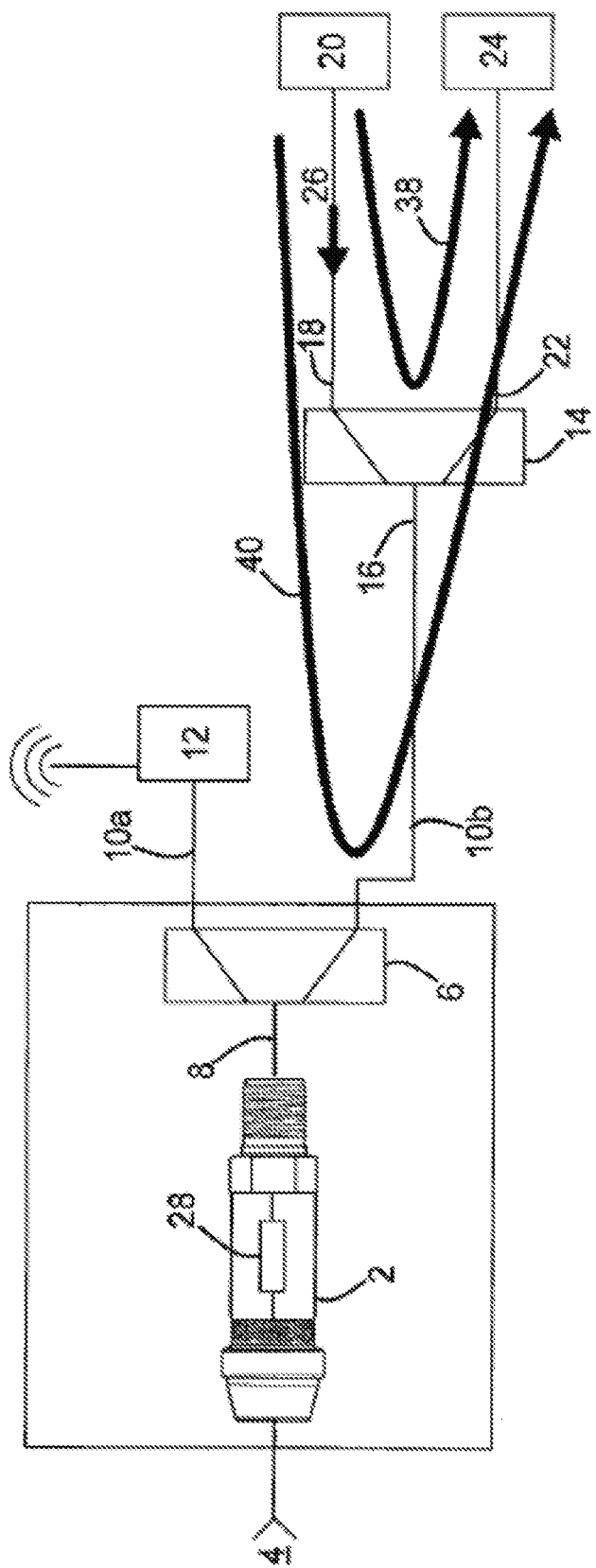
FIG. 1 schematically illustrates a portion of a home network.

Referring to FIG. 1, a portion of an exemplary home network includes a filter housing 2 located at the point of entry to a premises. In the disclosed embodiment, the filter housing 2 is a standard female f-connector configured to pass a provider bandwidth 4, which may be a CATV system, for example. An exemplary CATV system typically includes a downstream component and an upstream component. The provider bandwidth 4 may propagate a downstream bandwidth in the 50-1,000 MHz range, and also carry an upstream bandwidth in the 7-49 MHz range.

The provider bandwidth 4 passes through a MoCA-enabled splitter 6 having an input port 8 and two distribution ports 10a, 10b respectively. In one example, distribution port 10a is coupled via coaxial cable to a MoCA-enabled device 12 such as a wireless router. Distribution port 10b is coupled to a second MoCA-enabled splitter 14. The second splitter 14 likewise includes an input port 16, a second distribution port 18 connected to a second MoCA-enabled second device 20, such as a set top box, and a third distribution port 22 connected to a third MoCA-enabled third device 24, such as another set top box.

The second splitter 14 is adapted to freely transmit data on a home network bandwidth 26 from any port to any other port. For example, data on the home network bandwidth 26 may be transmitted from the second distribution port 18 to the third distribution port 22. In another example, data may be transmitted in an upstream direction from the first set top box 20 to the second distribution port 18 and through the second input port 16, through the distribution port 10b, then in a downstream direction through distribution port 10a to the wireless router 12. The data may include voice transmission, security, home heating/cooling instructions, and high definition video technologies, for example. The home network bandwidth 26 occupies an open spectrum bandwidth, that is, a frequency range outside the provider bandwidth 4. Referring to the exemplary CATV system above, the home network bandwidth 26 may carry signals in the 1125-1525 MHz range.

In the disclosed embodiment, the filter housing 2 includes internal filter circuitry to secure the home network bandwidth 26 from leaking upstream to other houses on the CATV network, thus protecting the privacy of the home network. One example of the internal filter circuitry, commonly referred to as a point-of-entry or MoCA filter 28, is described in U.S. patent application Ser. No. 12/501,041 entitled "FILTER CIRCUIT", which is incorporated herein by reference in its entirety.

Two important characteristics which determine the performance of the signals carried by the coaxial device are insertion loss and return loss. Insertion loss refers to the amount of attenuation the signal receives as it passes from the input to the output. Return loss refers to a measure of the reflected energy from the transmitted signal. The loss value is a negative logarithmic number expressed in decibels (dB) however, as used herein, the negative sign is dropped. Thus, a filter circuit initially having a loss characteristic of 1 dB that is improved to 20 dB improves (or decreases) the reflected signal level from about 80% to about 1%. As a rule of thumb, a 3 dB loss reduces power to one half, 10 dB to one tenth, 20 dB to one hundredth, and 30 dB to one thousandth. Therefore, the larger the insertion loss characteristic, the less energy that is lost passing through the circuit. The larger the return loss characteristic, the less energy that is reflected. Multipath return losses can be generated from splitters, coaxial cable, or point-of-entry filters, for example.

Figure 2:
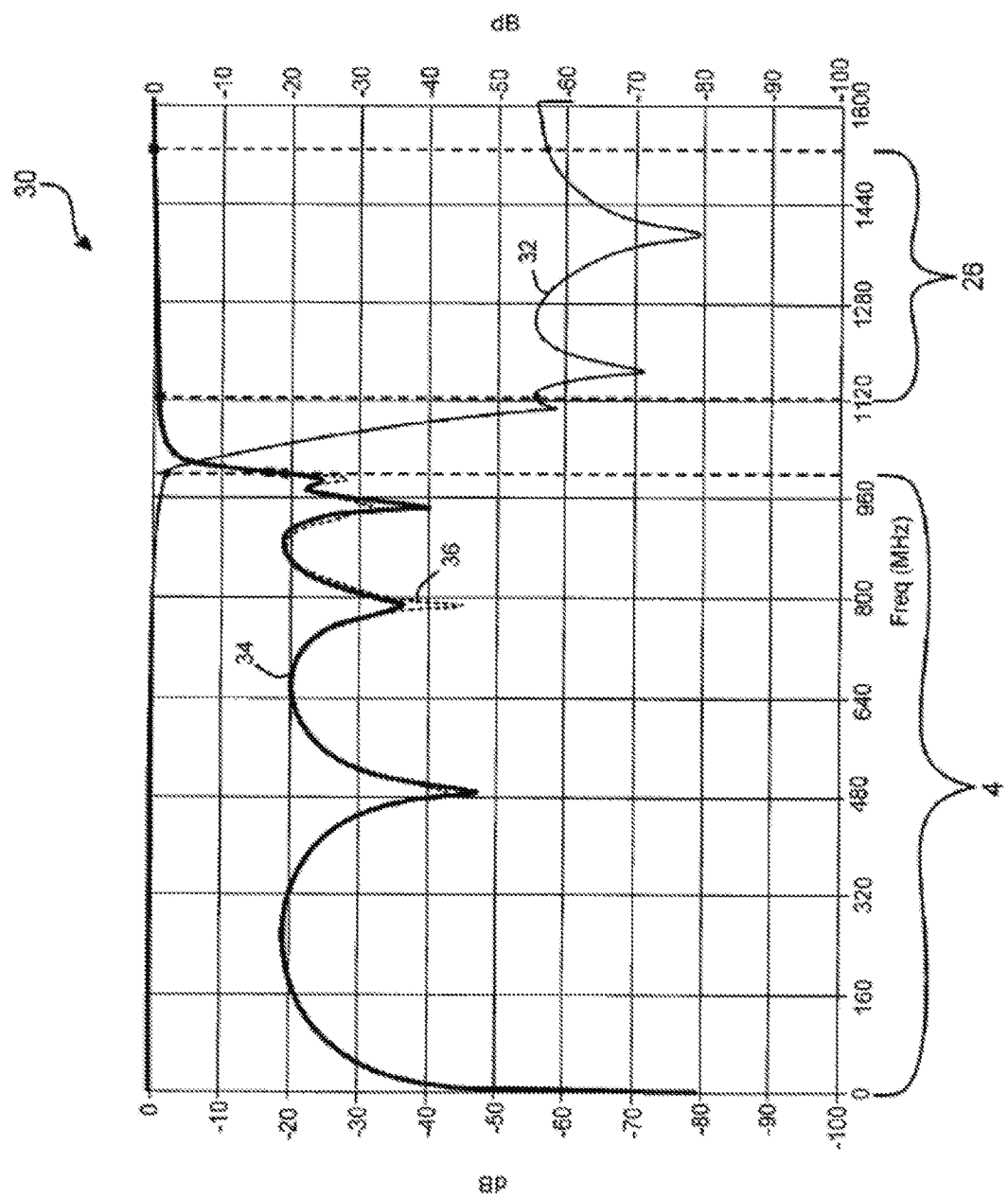
FIG. 2 is a chart showing the insertion lost and input/output loss for a filter circuit within the home network depicted in FIG. 1.

Referring to FIG. 2, a frequency response 30 of the exemplary MoCA filter 28 includes an insertion loss 32 between the connector input and the connector output. The insertion loss 32 trace can be interpreted to mean that signals in the provider bandwidth 4 (5 MHz-1002 MHZ) are permitted to pass through the connector, while the signals in the home network bandwidth 26 (1125 MHz-1525 MHz) are attenuated or blocked. The frequency response 30 further includes an input return loss 34 or reflection at the connector input port, and an output return loss 36 or reflection at the connector output port. The return losses 34, 36 are greater than about 20 dB in the pass band, or provider bandwidth 4, but are approximately 1 dB in the stop band, or home network bandwidth 26.

Although the return losses 34, 36 may be adequate in the provider bandwidth 4, very high reflections may be experienced in the home network bandwidth 26. Multipath distortions may be generated from the poor return loss produced from the filters stop band. Referring now back to FIG. 1, a primary transmission path 38 may be defined by data (such as high definition programming) propagating on the home network bandwidth 26 from the first set top box 20 in an upstream direction to the second distribution port 18 on the MoCA-enabled splitter 14, then in a downstream direction through the third distribution port 22 where it is received by the second set top box 24. In this example, data would also propagate from the second distribution port 18 through the second input port 16, through the distribution port 10b, and would be attenuated at the MoCA filter 28 in the filter housing 2. However, because the output return loss 36 is approximately 1 dB within the home network bandwidth 26, almost all the power is reflected and a secondary transmission path 40 sets up for the reflected signal. The data propagating along the secondary transmission path 40 arrives at the receiver (e.g., set top box 24) out of synch with the data in the primary transmission path 38, and multipath interference results.

Figure 3:
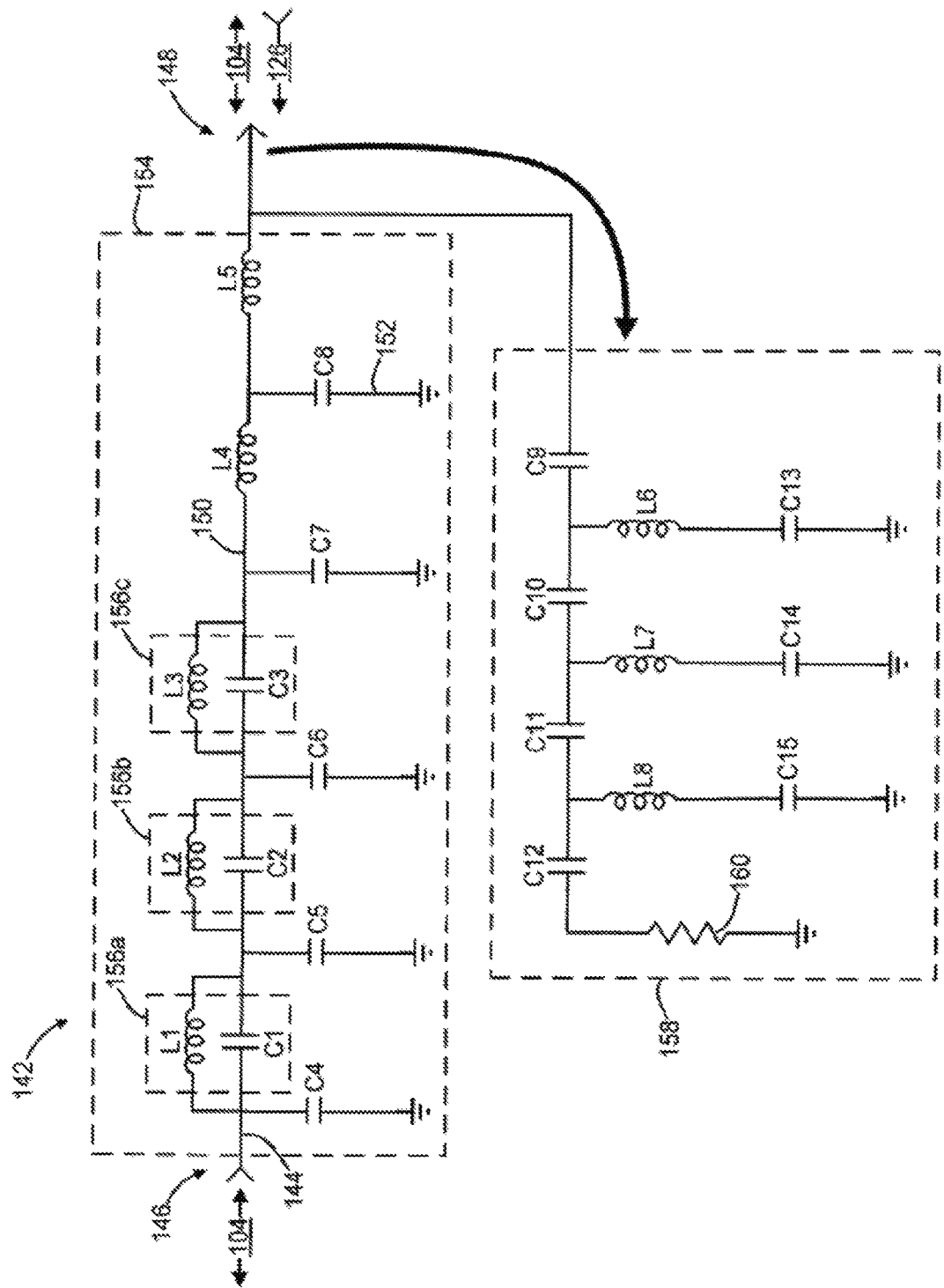
FIG. 3 is a circuit diagram, in schematic form, of one embodiment of a filter in accordance with the present invention

Referring to FIG. 3 of the drawings, wherein like numerals indicate like elements from FIGS. 1 and 2, one possible topology for an embodiment of an improved filter circuit 142 is provided that reduces the multipath interference experienced with prior MoCA filters. The filter circuit 142 includes a signal path 144 extending from an input 146 to an output 148. In one example, the input 146 is connected to the input port of the filter housing, which may be, in turn, in electrical communication with a supplier-side port such as a tap port (not shown). The output 148 may be adapted to receive signals comprising the provider bandwidth 104, the home network bandwidth 126, noise, and any other signals present on the coaxial cable. Conversely, the input 146 may be connected to the user-side port and the output 148 may be connected to the supplier-side port.

The signal path 144 includes a conductive path 150, such as the center conductor in a coaxial cable, to carry the upstream bandwidth, the downstream bandwidth, and the home network bandwidth. The signal path 144 further includes a ground 152, such as the outer sheath of the coaxial cable that provides a path to ground with various cable connector device.

The filter circuit 142 further includes a pass band filter portion 154 disposed along the signal path 144 between the input 146 and the output 148. The pass band filter portion 154 is configured to pass a first frequency spectrum in the provider bandwidth 104 and attenuate a second frequency spectrum in the home network bandwidth 126. In one embodiment, the pass band filter portion 154 is a hybrid parallel inductor/capacitor (LC) arrangement in which inductors L4 and L5, along with capacitor C8, increase the isolation of the low pass filter. Resonator or tank elements 156a-156c defined by L1/C1, L2/C2, and L3/C3 and capacitive shunts C4, C5, C6, and C7 collectively form an elliptic filter. Other filter designs, such as Butterworth, are equally operable but may require additional components to implement.

The filter circuit 142 further includes a multipath interference mitigation leg 158 operatively branched to ground from the signal path 144. The multipath interference mitigation leg 158 is configured to increase the return loss in the home network bandwidth. In the embodiment shown in FIG. 3, the multipath interference mitigation leg 158 is an absorptive Chebyshev filter circuit that increases the return loss at the output port of the connector without affecting the frequency response of the remaining circuit. The absorptive circuit includes a first lumped element comprising capacitors C9 and C10 in series, with an inductor/capacitor (LC) series connection of L6/C13 shunted to ground at a node between C9 and C10. The absorptive circuit further includes a second lumped element comprising capacitors C10 and C11 in series, with an inductor/capacitor (LC) series connection of L7/C14 shunted to ground at a node between C10 and C11. The absorptive circuit further includes a third lumped element comprising capacitors C11 and C12 in series, with an inductor/capacitor (LC) series connection of L8/C15 shunted to ground at a node between C11 and C12. A termination resistor 160 may be configured to match the impedance of the line load so as to prevent reflections due to impedance mismatch. In the illustrated example, the line load is 75 ohms, and the termination resistor 160 is likewise 75 ohms.

Figure 4:
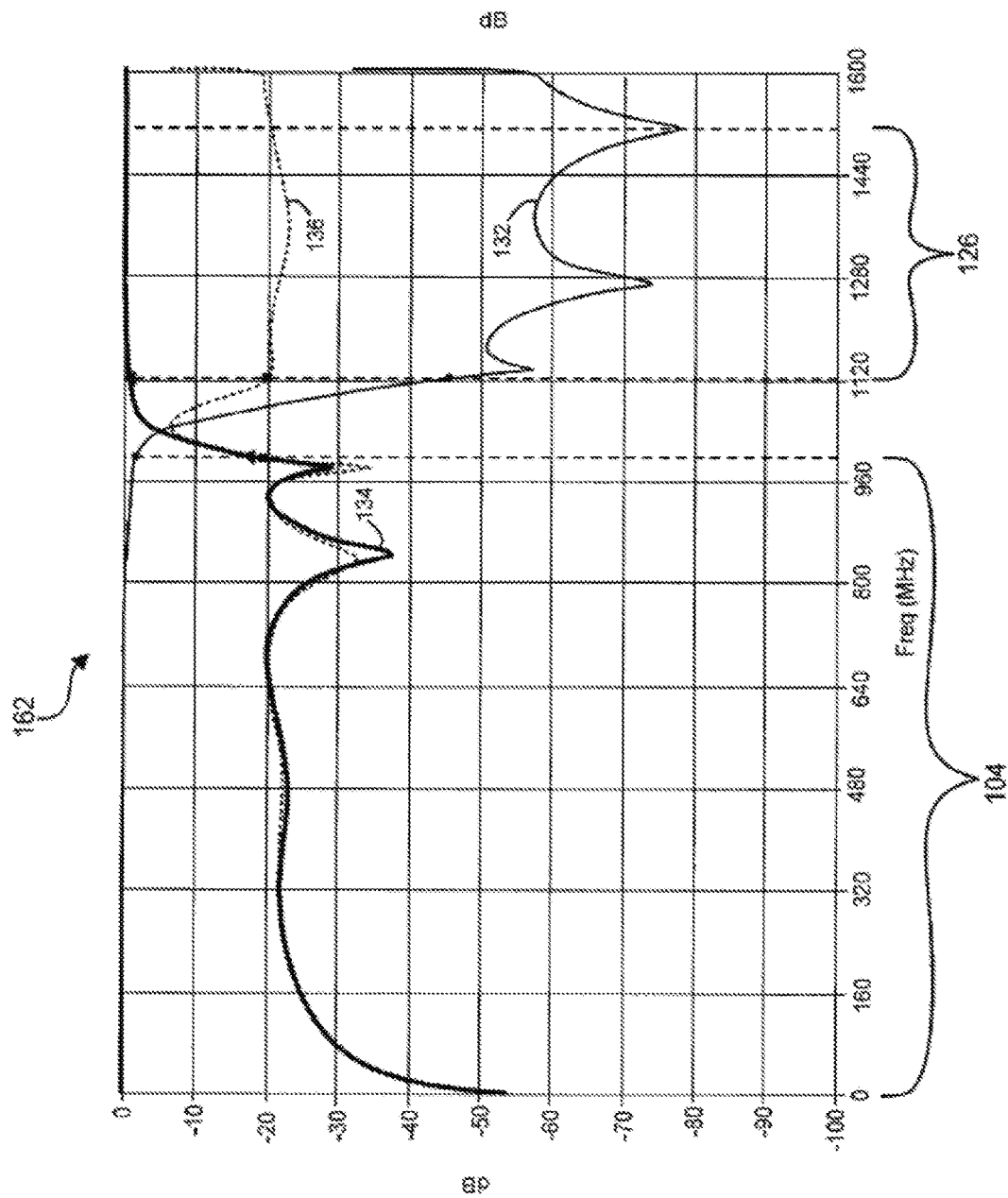
FIG. 4 is a chart showing the insertion loss and input/output return loss for the filter circuit shown in FIG. 3.

FIG. 4 plots the frequency response 162 of the filter circuit 142 shown in FIG. 3. The insertion loss 132 between the connector input and the connector output is essentially zero in the provider bandwidth 104, and greater than 50 dB in the home network bandwidth 126. Thus, the filter circuit 142 will pass the signals in the provider bandwidth 104 and attenuate the signals in the home network bandwidth 126. The input return loss 134 is essentially unchanged in that the loss of greater than 20 dB in the provider bandwidth 104 will reduce reflections from the input port of the connector. One noted improvement of the filter circuit 142 is that the output return loss 136 of the circuit is improved to greater than 20 dB in both the provider bandwidth 104 and the home network bandwidth 126. In this manner, reflections at the output port are reduced and the strength of the secondary transmission path (described in FIG. 1) will be reduced by as much as 99%. Although a return loss value of more than 20 dB is disclosed, the inventors have discovered that the return loss at the output may be more than 10 dB in the provider bandwidth and home network bandwidth, and the filter circuit of the present invention will still perform adequately.

Figure 5:
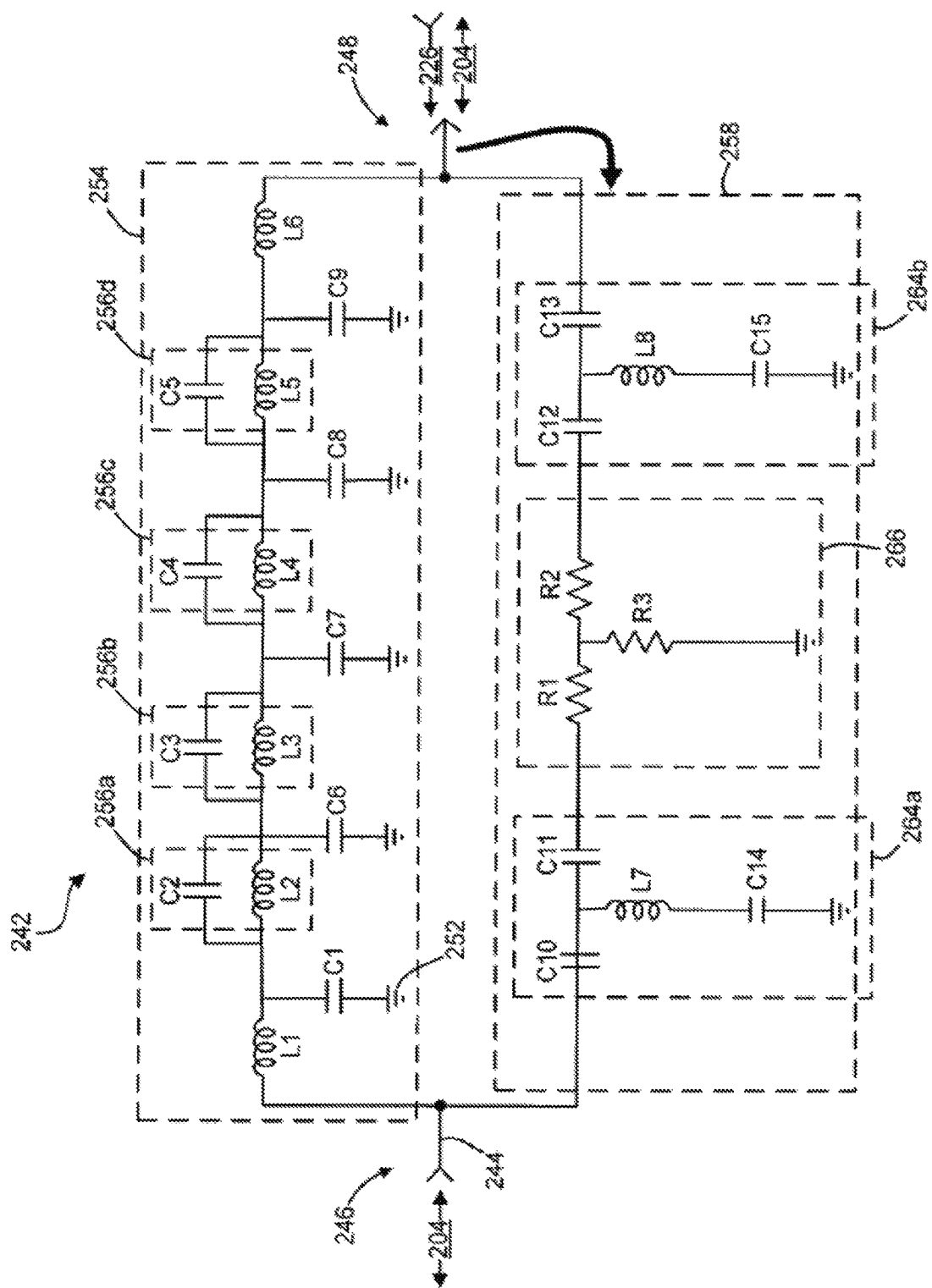
FIG. 5 is a circuit diagram, in schematic form, of a second embodiment of a filter in accordance with the present invention.

Referring now to FIG. 5 of the drawings, wherein like numerals indicate like elements from FIGS. 1 and 2, another topology of an improved filter circuit 242 is provided that reduces the multipath interference experienced with prior MoCA filters. The filter circuit 242 includes a signal path 244 extending from an input 246 to an output 248. In one example, the input 246 is connected to the input port of the coaxial cable connector, which may be, in turn, in electrical communication with a supplier-side port such as a tap port (not shown). The output 248 may be adapted to receive signals comprising the provider bandwidth 204, the home network bandwidth 226, noise, and any other signals present on the coaxial cable. Conversely, the input 246 may be connected to the user-side port and the output 248 may be connected to the supplier-side port. Further, the filter circuit 242 may be adapted to filter signals in both directions (e.g., bi-directional), so the physical location of the input 246 and output 248 may be arbitrary.

The signal path 244 includes a conductive path 250, such as the center conductor m a coaxial cable, to carry the upstream bandwidth, the downstream bandwidth, and the home network bandwidth. The signal path 244 further includes a ground 252, such as the outer sheath of the coaxial cable that provides a path to ground with various cable connector devices.

The filter circuit 242 further includes a pass band filter portion 254 disposed along the signal path 244 between the input 246 and the output 248. The pass band filter portion 254 is configured to pass a first frequency spectrum in the provider bandwidth 204 and attenuate a second frequency spectrum in the home network bandwidth 226. In this manner, the pass band filter portion 254 is a low pass filter. In one embodiment, the pass band filter portion 254 is a parallel inductor/capacitor (LC) arrangement in which inductors L1 and L6 increase the isolation of the low pass filter. Resonator or tank elements 256a-256d defined by L2/C2, L3/C3, L4/C4, and L5/C5 and capacitive shunts C1, C6, C7, C8, and C9 collectively form an elliptic filter. Other filter designs, such as Butterworth, are equally operable but may require additional components to implement.

The filter circuit 242 further includes a multipath interference mitigation leg 258 operatively branched to ground from the signal path 244. The multipath interference mitigation leg 258 is configured to increase the return loss in the home network bandwidth. In the embodiment shown in FIG. 5, the multipath interference mitigation leg 258 is an attenuator circuit that increases the return loss at the output port of the connector without affecting the frequency response of the remaining circuit. The attenuator circuit includes a high pass filter portion 264a, 264b and an attenuator portion 266. The high pass filter portions 264a, 264b are Tee-type circuits in one example, but may comprise other types. In the disclosed embodiment, the attenuator portion 266 is a Tee-type resistive attenuator comprising three resistors R1, R2, and R3. However, other arrangements are contemplated, such as a Piattenuator.

Figure 6:
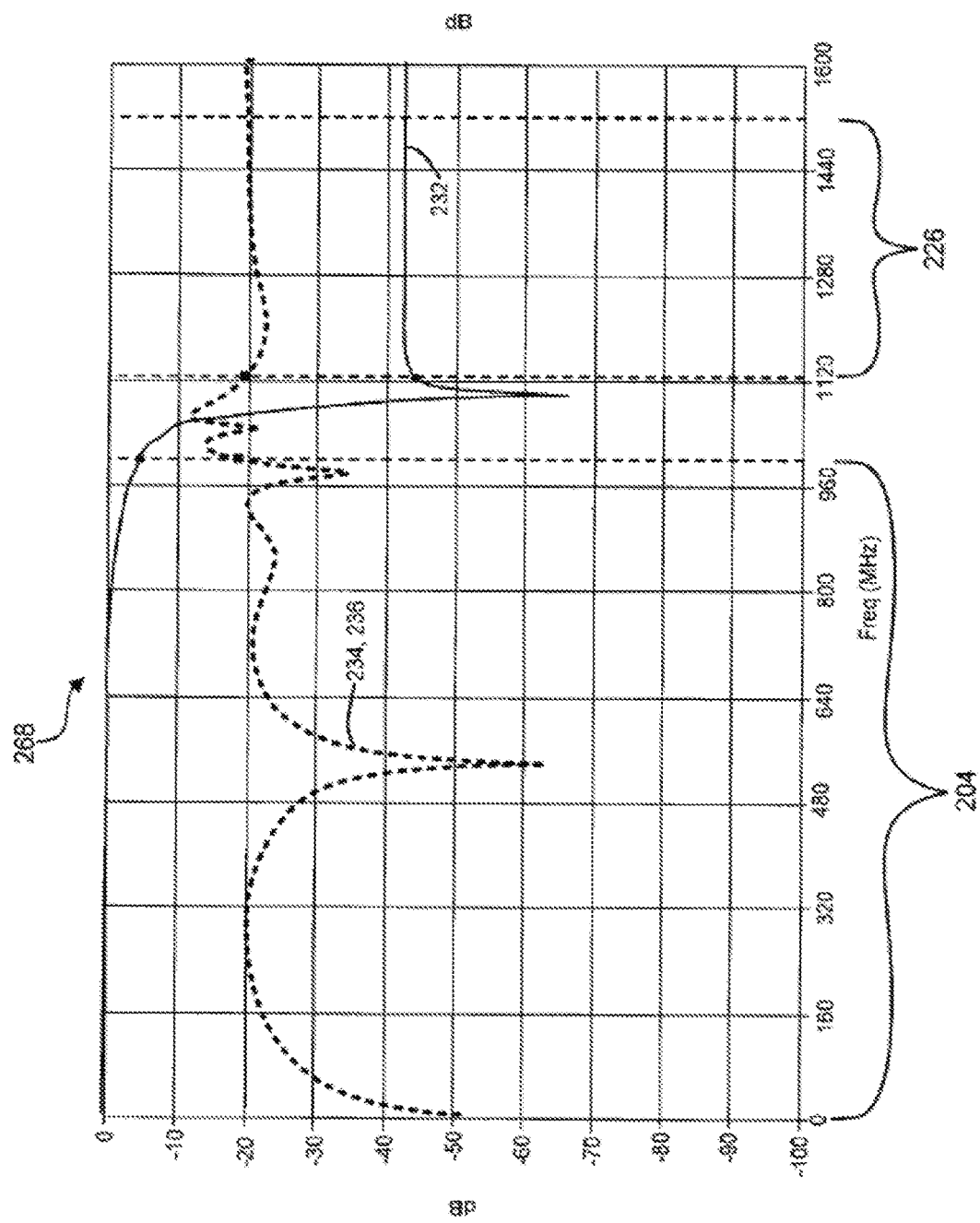
FIG. 6 is a chart showing the insertion loss and input/output return loss for the filter circuit shown in FIG. 5.

FIG. 6 plots the frequency response 268 of the filter circuit 242 shown in FIG. 5. The insertion loss 232 between the connector input and the connector output is essentially zero in the provider bandwidth 204, and greater than 40 dB in the home network bandwidth 226. Thus, the filter circuit 242 will pass the signals in the provider bandwidth 204 and attenuate the signals in the home network bandwidth 226. The input return loss 234 and output return loss 236 are essentially identical due to the symmetry of the circuit, and comprise a value of greater than 20 dB in both the provider bandwidth 204 and the home network bandwidth 226. In this manner, reflections at the input port and output port are reduced, and the strength of the secondary transmission path (described in FIG. 1) will be reduced by as much as 99%.

One advantage provided by the present invention is that home network multipath distortions at the filter port connections are minimized or even eliminated, thereby enhancing signal quality. Prior art filters designed for the MoCA standard, for example, generated significant multipath distortions from the poor return loss (typically less than 1 dB) produced from the filter's stop band.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. For example, although the embodiments disclosed herein comprise analog circuits, the inventors contemplate digital circuitry could be utilized without departing from the scope of the invention. Further, although specific terms are employed herein, they are used in a generic and descriptive sense only and not for purposes of limitation.

What is claimed is:

1. A filter circuit, comprising:
   an input;
   an output;
   a pass band filter portion between the input and the output, wherein the pass band filter portion is configured to pass signals between the input and the output in a first frequency spectrum and attenuate or block signals between the input and the output in a second frequency spectrum;
   an interference mitigation portion configured to be connected to the pass band filter portion, wherein the interference mitigation portion comprises an attenuator circuit that is configured to increase a return loss at the output in the second frequency spectrum; and
   wherein the second frequency spectrum is higher than the first frequency spectrum.

2. A filter circuit comprising:
   an input;
   an output;
   a pass band filter portion between the input and the output, wherein the pass band filter portion is configured to pass signals between the input and the output in a first frequency spectrum and attenuate or block signals between the input and the output in a second frequency spectrum; and
   an interference mitigation portion configured to be connected to the pass band filter portion, wherein the interference mitigation portion comprises an attenuator circuit that is configured to increase a return loss at the output in the second frequency spectrum without substantially affecting a frequency response of a remainder of the filter circuit; and
   wherein the second frequency spectrum is distinct from, and higher than, the first frequency spectrum.

3. The filter circuit of claim 2, wherein the pass band filter portion is configured to cause an insertion loss of less than 3 decibels (dB) between the input and the output in the first frequency spectrum, and wherein the insertion loss comprises an amount of attenuation the signals receive as the signals pass from the input to the output.

4. The filter circuit of claim 2, wherein the pass band filter portion is configured to cause an insertion loss of more than 20 decibels (dB) between the input in the first frequency spectrum and the output in the second frequency spectrum, and wherein the insertion loss comprises an amount of attenuation the signals receive as the signals pass from the input to the output.

5. The filter circuit of claim 2, wherein the pass band filter portion is configured to cause the return loss at the output to be more than 10 decibels (dB) in the first frequency spectrum, and wherein the return loss comprises a measure of a reflected energy from the signals.

6. The filter circuit of claim 1, wherein the pass band filter portion is configured to cause the return loss at the output to be more than 10 decibels (dB) in the second frequency spectrum, and wherein the return loss comprises a measure of a reflected energy from the signals.

7. The filter circuit of claim 2, wherein the attenuator circuit is also configured to increase the return loss at the input in the second frequency spectrum, and wherein the return loss is substantially the same at the input and the output.

8. The filter circuit of claim 7, wherein the return loss is substantially the same at the input and the output due to symmetry of the filter circuit.

9. The filter circuit of claim 2, wherein the interference mitigation portion comprises:
a first high pass portion configured to be connected to the pass band filter portion;
a second high pass portion; and
an attenuator portion comprising one or more resistors, wherein the attenuator portion is connected in series between the first and second high pass portions.

10. A filter circuit, comprising:
means for passing signals between an input and an output in a first frequency spectrum and attenuating or blocking signals between the input and the output in a second frequency spectrum, wherein the second frequency spectrum is distinct from, and higher than the first frequency spectrum; and
means for increasing a return loss at the output in the second frequency spectrum without substantially affecting a frequency response of a remainder of the filter circuit.

11. The filter circuit of claim 10, wherein the means for passing signals between the input and the output in the first frequency spectrum and attenuating or blocking signals between the input and the output in the second frequency spectrum is configured to cause an insertion loss of less than 3 decibels (dB) in the first frequency spectrum.

12. The filter circuit of claim 10, wherein the means for passing signals between the input and the output in the first frequency spectrum and attenuating or blocking signals between the input and the output in the second frequency spectrum are configured to cause an insertion loss of more than 20 decibels (dB) in the second frequency spectrum.

13. The filter circuit of claim 10, wherein the means for passing signals between the input and the output in the first frequency spectrum and attenuating or blocking signals between the input and the output in the second frequency spectrum are configured to cause the return loss at the output to be more than 10 decibels (dB) in the first frequency spectrum.

14. The filter circuit of claim 10, wherein the means for passing signals between the input and the output in the first frequency spectrum and attenuating or blocking signals between the input and the output in the second frequency spectrum are configured to cause the return loss at the output to be than 10 decibels (dB) in the second frequency spectrum.

15. The filter circuit of claim 10, further comprising means for increasing the return loss at the input in the second frequency spectrum.

16. The filter circuit of claim 15, wherein the return loss is substantially the same at the input and the output.

17. The filter circuit of claim 16, wherein the return loss is substantially the same at the input and the output due to symmetry of the filter circuit.

18. The filter circuit of claim 10, wherein the means for increasing the return loss comprises:
a first high pass portion;
a second high pass portion; and
an attenuator portion comprising one or more resistors, wherein the attenuator portion is connected in series between the first and second high pass portions.

19. A filter circuit, comprising:
a pass band filter portion configured to pass signals in a first frequency spectrum and attenuate or block signals in a second frequency spectrum, wherein the second frequency spectrum is higher than the first frequency spectrum, and wherein the pass band filter portion is configured to cause a return loss of more than 10 decibels (dB) in the first frequency spectrum.

20. The filter circuit of claim 1, wherein the interference mitigation portion comprises:
a first high pass portion configured to be connected to the pass band filter portion;
a second high pass portion; and
an attenuator portion comprising one or more resistors, wherein the attenuator portion is connected in series between the first and second high pass portions.

21. The filter circuit of claim 19, wherein the return loss is at an output of the filter circuit.

22. The filter circuit of claim 19, wherein the pass band filter portion is configured to cause the return loss to be more than 10 decibels (dB) in the second frequency spectrum.

23. The filter circuit of claim 22, wherein the return loss is at an output of the filter circuit.

24. The filter circuit of claim 19, wherein the pass band filter portion is configured to cause an insertion loss of less than 3 decibels (dB) in the first frequency spectrum.

25. The filter circuit of claim 24, wherein the insertion loss is between an input and an output of the filter circuit.

26. The filter circuit of claim 19, wherein the pass band filter portion is configured to cause an insertion loss of more than 20 decibels (dB) in the second frequency spectrum.

27. The filter circuit of claim 26, wherein the insertion loss is between an input and an output of the filter circuit.

28. The filter circuit of claim 19, wherein the pass band filter portion is configured to cause an insertion loss of less than 3 decibels (dB) in the first frequency spectrum and more than 20 dB in the second frequency spectrum, and wherein the insertion loss is between an input and an output of the filter circuit.

29. The filter circuit of claim 19, further comprising an interference mitigation portion configured to be connected to the pass band filter portion, wherein the interference mitigation portion is configured to increase the return loss in the second frequency spectrum.

30. The filter circuit of claim 29, wherein the interference mitigation portion comprises an attenuator circuit that is configured to increase the return loss at an output of the filter circuit without substantially affecting a frequency response of a remainder of the filter circuit.

31. The filter circuit of claim 1, wherein the pass band filter portion is configured to cause an insertion loss of less than 3 decibels (dB) between the input and the output in the first frequency spectrum, and wherein the insertion loss comprises an amount of attenuation the signals receive as the signals pass from the input to the output.

32. The filter circuit of claim 1, wherein the pass band filter portion is configured to cause an insertion loss of more than 20 decibels (dB) between the input in the first frequency spectrum and the output in the second frequency spectrum, and wherein the insertion loss comprises an amount of attenuation the signals receive as the signals pass from the input to the output.

33. The filter circuit of claim 1, wherein the pass band filter portion is configured to cause the return loss at the output to be more than 10 decibels (dB) in the first frequency spectrum, and wherein the return loss comprises a measure of a reflected energy from the signals.

34. The filter circuit of claim 1, wherein the pass band filter portion is configured to cause the return loss at the output to be more than 10 decibels (dB) in the second frequency spectrum, and wherein the return loss comprises a measure of a reflected energy from the signals.

35. The filter circuit of claim 1, wherein the attenuator circuit is also configured to increase the return loss at the input in the second frequency spectrum, and wherein the return loss is substantially the same at the input and the output.

36. The filter circuit of claim 35, wherein the return loss is substantially the same at the input and the output due to symmetry of the filter circuit.

37. A filter circuit comprising:
a pass band filter portion configured to pass a first frequency spectrum signal between an input and an output and attenuate or block a second frequency spectrum signal between the input and the output;
an interference attenuator portion configured to selectively increase a return loss at the output in a second frequency spectrum corresponding to the second frequency spectrum signal;
wherein the first frequency spectrum signal is at a first frequency range; and
wherein the second frequency spectrum signal is at a second frequency range that is higher than the first frequency range of the first frequency spectrum signal.

38. The filter circuit of claim 37, wherein the pass band filter portion is configured to cause the return loss at the output to be more than 10 decibels (dB) in the second frequency spectrum, and wherein the return loss comprises a measure of a reflected energy from the signals.

39. The filter circuit of claim 37, wherein the pass band filter portion is configured to cause an insertion loss of less than 3 decibels (dB) between the input and the output in the first frequency spectrum, and wherein the insertion loss comprises an amount of attenuation the signals receive as the signals pass from the input to the output.

40. The filter circuit of claim 37, wherein the pass band filter portion is configured to cause an insertion loss of more than 20 decibels (dB) between the input in the first frequency spectrum and the output in the second frequency spectrum, and wherein the insertion loss comprises an amount of attenuation the signals receive as the signals pass from the input to the output.

41. The filter circuit of claim 37, wherein the pass band filter portion is configured to cause the return loss at the output to be more than 10 decibels (dB) in the first frequency spectrum, and wherein the return loss comprises a measure of a reflected energy from the signals.

42. A filter circuit comprising:
means for passing a first frequency spectrum signal between an input and an output;
means for attenuating or blocking a second frequency spectrum signal between the input and the output;
means for selectively increasing a return loss at the output in a second frequency spectrum corresponding to the second frequency spectrum signal;
wherein the first frequency spectrum signal is at a first frequency range; and
wherein the second frequency spectrum signal is at a second frequency range that is higher than the first frequency range of the first frequency spectrum signal.

43. The filter circuit of claim 42, wherein the pass band filter portion is configured to cause the return loss at the output to be more than 10 decibels (dB) in the second frequency spectrum, and wherein the return loss comprises a measure of a reflected energy from the signals.

44. The filter circuit of claim 42, wherein the pass band filter portion is configured to cause an insertion loss of less than 3 decibels (dB) between the input and the output in the first frequency spectrum, and wherein the insertion loss comprises an amount of attenuation the signals receive as the signals pass from the input to the output.

45. The filter circuit of claim 42, wherein the pass band filter portion is configured to cause an insertion loss of more than 20 decibels (dB) between the input in the first frequency spectrum and the output in the second frequency spectrum, and wherein the insertion loss comprises an amount of attenuation the signals receive as the signals pass from the input to the output.

46. The filter circuit of claim 42, wherein the pass band filter portion is configured to cause the return loss at the output to be more than 10 decibels (dB) in the first frequency spectrum, and wherein the return loss comprises a measure of a reflected energy from the signals.

47. A filter circuit comprising:
a pass band filter portion configured to pass a first frequency spectrum signal between an input and an output and attenuate or block a second frequency spectrum signal between the input and the output;
wherein the pass band filter portion is configured to selectively cause a return loss of more than 10 decibels (dB) in the first frequency spectrum;
wherein the first frequency spectrum signal is at a first frequency range; and
wherein the second frequency spectrum signal is at a second frequency range that is higher than the first frequency range of the first frequency spectrum signal.

48. The filter circuit of claim 47, wherein the pass band filter portion is configured to cause the return loss at the output to be more than 10 decibels (dB) in the second frequency spectrum, and wherein the return loss comprises a measure of a reflected energy from the signals.

49. The filter circuit of claim 47, wherein the pass band filter portion is configured to cause an insertion loss of less than 3 decibels (dB) between the input and the output in the first frequency spectrum, and wherein the insertion loss comprises an amount of attenuation the signals receive as the signals pass from the input to the output.

50. The filter circuit of claim 47, wherein the pass band filter portion is configured to cause an insertion loss of more than 20 decibels (dB) between the input in the first frequency spectrum and the output in the second frequency spectrum, and wherein the insertion loss comprises an amount of attenuation the signals receive as the signals pass from the input to the output.

51. The filter circuit of claim 47, wherein the pass band filter portion is configured to cause the return loss at the output to be more than 10 decibels (dB) in the first frequency spectrum, and wherein the return loss comprises a measure of a reflected energy from the signals.

52. A filter circuit comprising:
- means for passing a first frequency spectrum signal between an input and an output;
- means for attenuating or blocking a second frequency spectrum signal between the input and the output;
- means for selectively causing a return loss of more than 10 decibels (dB) in the first frequency spectrum;
- wherein the first frequency spectrum signal is at a first frequency range; and
- wherein the second frequency spectrum signal is at a second frequency range that is higher than the first frequency range of the first frequency spectrum signal.

53. The filter circuit of claim 52, wherein the means for passing a first frequency spectrum signal between an input and an output is configured to cause the return loss at the output to be more than 10 decibels (dB) in the second frequency spectrum, and wherein the return loss comprises a measure of a reflected energy from the signals.

54. The filter circuit of claim 52, wherein the means for passing a first frequency spectrum signal between an input and an output is configured to cause an insertion loss of less than 3 decibels (dB) between the input and the output in the first frequency spectrum, and wherein the insertion loss comprises an amount of attenuation the signals receive as the signals pass from the input to the output.

55. The filter circuit of claim 52, wherein the means for passing a first frequency spectrum signal between an input and an output is configured to cause an insertion loss of more than 20 decibels (dB) between the input in the first frequency spectrum and the output in the second frequency spectrum, and wherein the insertion loss comprises an amount of attenuation the signals receive as the signals pass from the input to the output.

56. The filter circuit of claim 52, wherein the means for passing a first frequency spectrum signal between an input and an output is configured to cause the return loss at the output to be more than 10 decibels (dB) in the first frequency spectrum, and wherein the return loss comprises a measure of a reflected energy from the signals.

* * * * *